(12) United States Patent
Lin et al.

(10) Patent No.: US 10,770,327 B2
(45) Date of Patent: Sep. 8, 2020

(54) SYSTEM AND METHOD FOR CORRECTING NON-IDEAL WAFER TOPOGRAPHY

(71) Applicant: Taiwan Semiconductor Manufacturing Co., Ltd., Hsin-Chu (TW)

(72) Inventors: Cheng-Mu Lin, Hsin-Chu (TW); Chi-Hung Liao, Sanchong (TW); Yi-Ming Dai, Hsinchu (TW); Yueh Lin Yang, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 131 days.

(21) Appl. No.: 15/941,568

(22) Filed: Mar. 30, 2018

(65) Prior Publication Data
US 2019/0035664 A1 Jan. 31, 2019

Related U.S. Application Data

(60) Provisional application No. 62/538,414, filed on Jul. 28, 2017.

(51) Int. Cl.
*H01L 21/68* (2006.01)
*H04N 5/225* (2006.01)
*G06T 7/00* (2017.01)
*H01L 21/67* (2006.01)

(52) U.S. Cl.
CPC .......... *H01L 21/682* (2013.01); *G06T 7/0004* (2013.01); *H01L 21/67288* (2013.01); *H01L 21/681* (2013.01); *H04N 5/2256* (2013.01); *G06T 2207/10152* (2013.01); *G06T 2207/30148* (2013.01)

(58) Field of Classification Search
CPC ......... G06T 2207/30148; G06T 7/0004; G06T 2207/10152; H01L 21/682; H01L 21/67288; H01L 21/681; H01L 21/67242; H01L 21/67259; H01L 23/544; H01L 2223/54426; H04N 5/2256
See application file for complete search history.

(56) References Cited

U.S. PATENT DOCUMENTS

| | | | | |
|---|---|---|---|---|
| 6,376,329 B1 * | 4/2002 | Sogard | .................. | G03F 9/7084 438/401 |
| 6,768,539 B2 * | 7/2004 | Gui | ..................... | G03F 7/70216 355/53 |
| 6,936,385 B2 * | 8/2005 | Lof | ........................ | G03F 9/7011 355/53 |
| 7,251,018 B2 * | 7/2007 | Van Buel | ............ | G03F 7/70716 355/53 |
| 7,420,676 B2 * | 9/2008 | Lof | ........................ | G03F 9/7003 356/401 |
| 9,214,353 B2 * | 12/2015 | Yonehara | .............. | H01L 21/304 |
| 9,281,251 B2 * | 3/2016 | Fonseca | ............. | H01L 21/30625 |
| 9,711,419 B2 * | 7/2017 | Fonseca | ............. | G03F 7/70783 |

(Continued)

*Primary Examiner* — Obafemi O Sosanya
(74) *Attorney, Agent, or Firm* — Duane Morris LLP

(57) ABSTRACT

A scanner includes a light source configured to apply a light to a backside of a wafer. The light is reflected from the backside of the wafer. A first mirror is configured to receive the light from the backside of the wafer and reflect the light. A sensor is configured to receive the light from the first mirror and generate an output signal indicative of a backside topography of the wafer.

20 Claims, 5 Drawing Sheets

(56) References Cited

U.S. PATENT DOCUMENTS

| | | | |
|---|---|---|---|
| 10,241,418 B2* | 3/2019 | Hauptmann | G03F 1/84 |
| 2002/0109825 A1* | 8/2002 | Gui | G03F 7/70691 |
| | | | 355/53 |
| 2003/0159528 A1* | 8/2003 | Kim | G01N 21/9501 |
| | | | 73/865.8 |
| 2007/0109524 A1* | 5/2007 | Kawakubo | G03F 7/70633 |
| | | | 355/77 |
| 2012/0086800 A1* | 4/2012 | Vladimirsky | G06K 9/2036 |
| | | | 348/128 |
| 2013/0215404 A1* | 8/2013 | Den Boef | G01J 3/4412 |
| | | | 355/44 |
| 2015/0211836 A1* | 7/2015 | deVilliers | H01L 22/12 |
| | | | 702/36 |
| 2018/0025899 A1* | 1/2018 | Kang | H01L 21/02016 |
| | | | 216/89 |
| 2018/0068861 A1* | 3/2018 | deVilliers | G03F 7/70633 |
| 2018/0082833 A1* | 3/2018 | Kang | H01L 21/67196 |
| 2019/0033136 A1* | 1/2019 | Warashina | G01J 3/4535 |

* cited by examiner

SYSTEM AND METHOD FOR CORRECTING NON-IDEAL WAFER TOPOGRAPHY

CROSS-REFERENCE TO RELATED APPLICATION

This application claims benefit of U.S. Provisional Application Ser. No. 62/538,414, filed on Jul. 28, 2017, and entitled "BACKSIDE WAFER SCANNING FOR OVERLAY CORRECTION," which is incorporated herein by reference in its entirety.

BACKGROUND

Integrated circuits (ICs) are normally made through multiple process steps in a semiconductor wafer fabrication facility, where each process step places a patterned layer on a wafer. In order for the ICs to operate correctly, these patterned layers must be aligned accurately with each other. Misalignment between the patterned layers may cause short circuits or connection failures which significantly impact device yield. Misalignment measurement between patterned layers, i.e. overlay (OVL) metrology, on the wafer is one of the most important processes in the manufacturing integrated circuit devices. In particular, OVL metrology refers to the determination of the alignment accuracy of one patterned layer with respect to another patterned layer next to it. With the increase in complexity of integrated circuits, the measurement of the OVL metrology becomes more and more important and difficult.

In a traditional fabrication facility that manufactures different product wafers with different patterns and feature sizes, integrated metrology (IM) systems have a fixed setting for performing OVL measurements, irrespective of the different product wafers that pass through them. Different product wafers are produced with different patterns and by different processes. The different processes (or variations within a single process) generate wafers having different surface topographies, which effect OVL measurements and error rates. Current systems utilize alignment markings on a front side of the wafer to provide OVL alignment prior to exposing the wafer to a radiation source. Notably, the current system utilizes alignment markings that are only able to compensate for linear OVL errors and cannot compensate for non-linear OVL errors, such as errors formed in a Z-axis.

BRIEF DESCRIPTION OF THE DRAWINGS

Aspects of the present disclosure are best understood from the following detailed description when read with the accompanying figures. It is noted that, in accordance with the standard practice in the industry, various features are not necessarily drawn to scale. In fact, the dimensions of the various features may be arbitrarily increased or reduced for clarity of discussion.

DETAILED DESCRIPTION

Figure 1A:
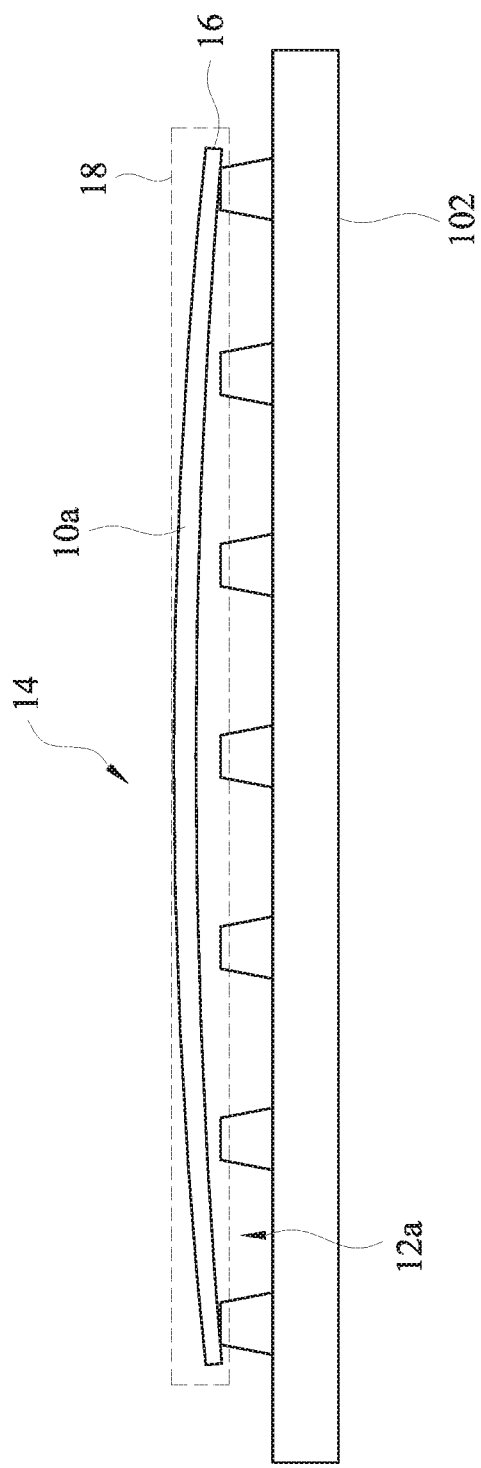
FIG. 1A illustrates one embodiment of an ideal wafer topography.

The following disclosure provides many different embodiments, or examples, for implementing different features of the subject matter. Specific examples of components and arrangements are described below to simplify the present disclosure. These are, of course, merely examples and are not intended to be limiting. For example, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Moreover, "first", "second", "third", etc. may be used herein for ease of description to distinguish between different elements of a figure or a series of figures. "first", "second", "third", etc. are not intended to be descriptive of the corresponding element. Therefore, "a first wafer" described in connection with a first figure may not necessarily corresponding to a "first wafer" described in connection with another figure.

In various embodiments, a system and method for compensating for non-ideal wafer topography prior to and during semiconductor manufacture is disclosed. The system includes a wafer table sized and configured to receive a semiconductor wafer thereon. The wafer table includes a plurality of supports configured to support the wafer. A backside scanner is disposed beneath the wafer table. The backside scanner includes a light source and a first mirror. The light source is positioned to generate a light that reflects from a backside surface of the wafer to the first mirror. The first mirror reflects light from the backside of the wafer to a sensor. The sensor is configured to receive the reflected light and generate a signal indicative of the surface topography of the backside of the semiconductor wafer. In some embodiments, the light is reflected from the first mirror to a second mirror and from the second mirror to the sensor.

Figure 1B:
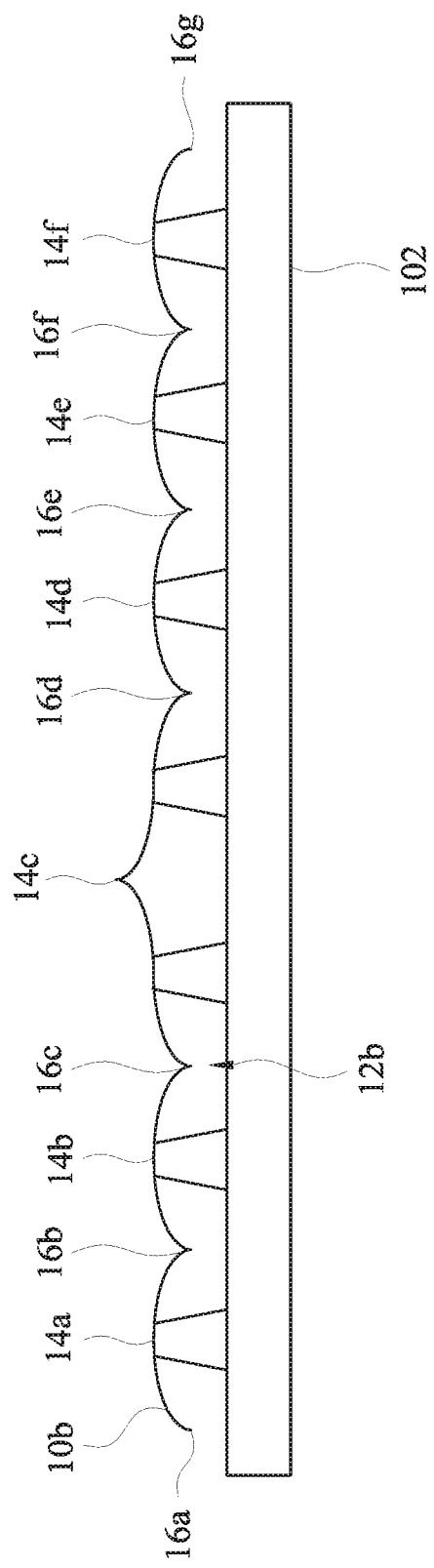
FIG. 1B illustrates a non-ideal wafer topography, in accordance with some embodiments.

FIG. 1A illustrates a first wafer 10a having an ideal wafer topography 12a and FIG. 1B illustrates a second wafer 10b having a non-ideal (or real-world) wafer topography 12b, in accordance with some embodiments. The ideal wafer topography 12a has a backside topography defined by a continuous spherical curve 14 defining a maximum at a center of the first wafer 10a and a planar edge 16 extending about the circumference of the first wafer 10a. When the first wafer 10a is clamped to a wafer table 102, the first wafer 10a is flattened and defines a planar wafer topography 18 (indicated with dashed lines).

In contrast, the non-ideal wafer topography 12b defines a plurality of curves 14a-14f each having a local maximum and multiple edges 16a-16g. For example, in the illustrated embodiment, the non-ideal wafer topography 12b includes six separate curvatures 14a-14f each extending from a first edge 16a-16f to a second edge 16b-16g. It will be understood by those skilled in the art that individual curvatures 14a-14f (or local maximums) are generated by the wafer forming process and vary from wafer to wafer. Although specific non-ideal topologies are illustrated herein as examples, it will be appreciated that a wafer 10b can have any non-ideal topography 12b and is within the scope of this disclosure.

In some embodiments, the non-ideal wafer topography 12b prevents the second wafer 10b from defining a planar topography when coupled to the wafer table 102. In contrast, the second wafer 10b includes a non-ideal topography 12b even when coupled (e.g., clamped) to the wafer table 102. For example, in some embodiments, the second wafer 10b includes one or more of the local curves 14a-14f and/or edges 16a-16g when coupled to the wafer table 102. In other embodiments, the second wafer 10b has a lesser and/or greater number of local curves and/or edges when clamped to the wafer table 102, but still fails to define a planar surface.

The non-ideal topography 12b of the second wafer 10b results in one or more errors during semiconductor manufacturing. In some embodiments, one or more errors are generated by an interaction between the non-ideal topography of the second wafer 10b, a clamping effect of the wafer table 102, and/or a surface roughness of the clamping table 102 during semiconductor manufacture. For example, in some embodiments, the non-ideal topography 12b, clamping effect, and/or surface roughness combine to generate overlay (OVL) errors, such as linear and/or non-linear OVL errors. Although embodiments are discussed herein including non-linear errors in a Z-direction, it will be appreciated that the disclosed system and methods and can be used to compensate for any suitable errors, including, but not limited to, errors in an X, Y, and/or Z direction.

Figure 2:
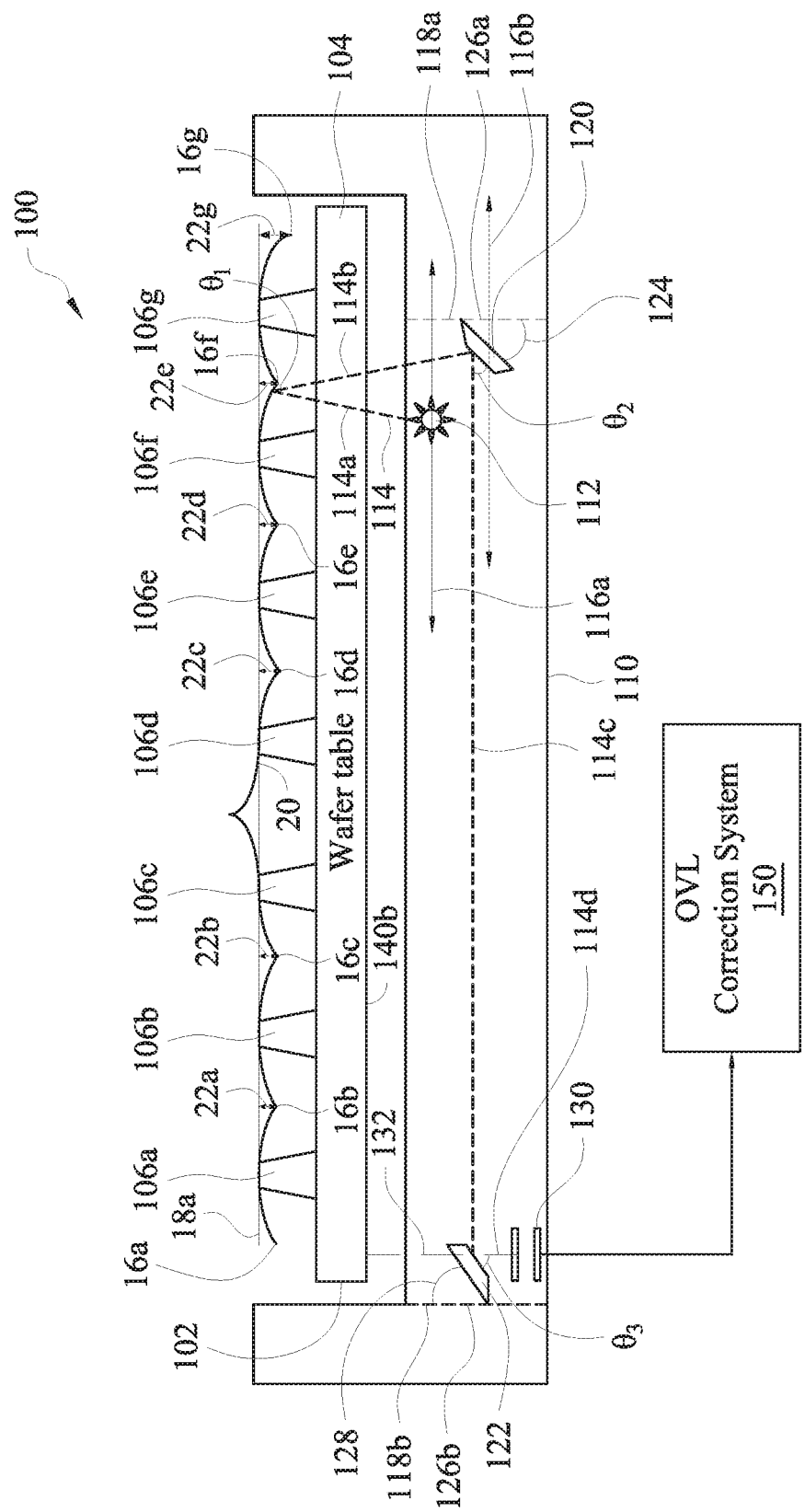
FIG. 2 illustrates a system for compensating for non-ideal wafer topography during semiconductor manufacturing, in accordance with some embodiments.

FIG. 2 illustrates a system 100 configured to detect and compensate for non-linear OVL errors during semiconductor processing, in accordance with some embodiments. The system 100 includes a wafer table 102 and a backside scanner 110. The wafer table 102 includes a body 104 and a plurality of wafer supports 106a-106g that extend from a top surface 104a of the body 104. The plurality of wafer supports 106a-106g have a predetermined spacing and a predetermined height configured to support a wafer 10c thereon. Although the wafer supports 106a-106g are designed to have equal spacing and equal heights, process and manufacturing variations can result in varied spacing and/or heights for each of the wafer supports 106a-106g. The non-ideal variations of the wafer supports 106a-106g are referred to herein as a surface roughness of the wafer table 102.

The wafer 10c is similar to the wafer 10b discussed above with respect to FIG. 1B, and similar description is not repeated herein. The wafer 10c includes a plurality of local curves having local minimums 16a-16g. Each of the local minimums has a spacing 22a-22g from an ideal planar topography 18. The wafer supports 106a-106g can be coupled to a wafer 10c using any suitable coupling mechanism. For example, in some embodiments, the wafer 10c is coupled to the wafer table 102 by a vacuum coupling, a mechanical edge coupling, and/or any other suitable coupling mechanism.

In some embodiments, a backside scanner 110 is positioned beneath and/or adjacent to the wafer table 102. The backside scanner 110 is configured to generate a backside scan of the backside surface 20 of the wafer 10c indicative of the actual wafer topography 12c of the wafer 10c. The backside scan is provided to an OVL correction system 150 that is configured to correct for non-linear OVL errors in the wafer 10c prior to and/or during semiconductor manufacturing.

In some embodiments, the backside scanner 110 includes a light source 112 configured to generate a light 114. The light source 112 is configured to direct the light 114a at a backside surface 20 of the wafer 10c. The light 114a is reflected from the backside surface 20 at a first incident angle $\Theta_1$ related to the backside topography of the wafer 10c. In some embodiments, the light source 112 is adjustable to direct the light 114a at different points on the backside surface 20. For example, in some embodiments, a horizontal position and/or an angle of the light source 112 is adjustable, as discussed in greater detail below.

The light source 112 can include any suitable light source, such as a lamp and/or other suitable light source. Although embodiments are discussed herein including a light source 112 configured to generate a light 114, it will be appreciated that the light source 112 can be configured to generate a targeted light and/or a wide area light (including a plurality of lights 114). The targeted light can be generated by any suitable light source 112, such as a laser. A wide area light can be generated by any suitable light source, such as a light-emitting diode (LED). Although embodiments are discussed herein using specific light sources, it will be appreciated that any suitable light source or combination of light sources can be used to generate the light 114.

In some embodiments, a position of the light source 112 is adjustable. For example, in some embodiments, the light source 112 is horizontally moveable along a first horizontal axis 116a. The light source 112 can be moved by any suitable mechanism, such as, for example, an automated and/or manual mechanism. In some embodiments, the light source 112 is continuously moveable to any point along the first horizontal axis 116a from a first position 118a to a second position 118b. In other embodiments, the light source 112 is moveable to one of a plurality of discrete positions along the first horizontal axis 116a from the first position 118a to the second position 118b.

In some embodiments, an orientation angle of the light source 112 with respect to the horizontal axis 116a is adjustable. For example, in some embodiments, an orientation angle of the light source 112 is adjustable to direct the light 114a at various positions on the backside 20 of the wafer 10c. The orientation angle of the light source 112 can be continuously adjustable from a first angle to a second angle and/or can be adjustable to one of a plurality of discrete angles. In some embodiments, the orientation angle is continuously adjustable from the first angle to the second angle to move, or sweep, the light 114a across the topography of the backside 20.

In some embodiments, the backside scanner 110 includes a first mirror 120. The first mirror 120 is configured to receive the reflected light 114b from the backside surface 20 of the wafer 10c. The first mirror 120 is positioned at a first orientation angle 124 with respect to a second horizontal axis 116b. The second horizontal axis 116b is parallel with the first horizontal axis 116a. The first orientation angle 124 can be any suitable angle, such as, for example, any angle greater than 0° and less than 90°. The first orientation angle 124 is selected such that the light 114b is reflected from the first mirror 120 at a second incident angle $\Theta_2$. It will be appreciated that the first mirror 120 can include any suitable reflective surface, such as, for example, a glass, metal, and/or other reflective surface configured to reflect the light 114b at the second incident angle $\Theta_2$. In some embodiments, a horizontal position and/or an angle of the first mirror 120 is adjustable, as discussed in greater detail below.

In some embodiments, a position of the first mirror 120 is adjustable. For example, in some embodiments, the first mirror 120 is horizontally moveable along the second horizontal axis 116*b*. The first mirror 120 can be moved by any suitable mechanism, such as, for example, an automated and/or manual mechanism. In some embodiments, the first mirror 120 is continuously moveable to any point along the second horizontal axis 116*b* from a first position 126*a* to a second position 126*b*. In other embodiments, first mirror 120 can be positioned at one of a plurality of discrete positions along the second horizontal axis 116*b* from the first position 126*a* to the second position 126*b*. In other embodiments, the horizontal position of the first mirror 120 is fixed.

In some embodiments, the first orientation angle 124 between the first mirror 120 and the second horizontal axis 116*b* is adjustable. The first orientation angle 124 is adjusted to reflect the light 114*b* from a different portion of the backside 20 of the wafer 10*c*. For example, in some embodiments, the first orientation angle is continuously adjustable from a first angle to a second angle to receive reflected light from various positions on the backside 20 to image the topography of the wafer 10*c*. In other embodiments, the first orientation angle is fixed.

In some embodiments, the horizontal positions and/or orientation angles of the light source 112 and the first mirror 120 are related. For example, in some embodiments, horizontal movement of the light source 112 on the first horizontal axis 116*a* of $\Delta x_1$ corresponds to a horizontal movement of the first mirror 120 on the second horizontal axis 116*b* of $\Delta x_2$. In some embodiments, $\Delta x_1$ and $\Delta x_2$ are equal, although it will be appreciated that movement of the light source 112 on the first horizontal axis 116*a* can correspond to a greater and/or lesser movement of the first mirror 120 on the second horizontal axis 116*b*.

As another example, in some embodiments, an angle adjustment of the orientation angle of the light source 112 of $\Delta\Theta_1$ with respect to the first horizontal axis 116*a* correspond to an angle adjustment of the first mirror 120 of $\Delta\Theta_2$ with respect to the second horizontal axis 116*b*. In some embodiments, $\Delta\Theta_1$ and $\Delta\Theta_2$ are equal, although it will be appreciated that an angle adjustment of the light source 112 can corresponds to a greater and/or lesser angle adjustment of the first mirror 120.

In some embodiments, horizontal movement of one of the light source 112 or the first mirror 120 corresponds to an orientation angle adjustment of the other of the light source 112 or the first mirror 120. For example, in some embodiments, a change in the orientation angle of the light source 112 with respect to the first horizontal axis 116*a* of $\Delta\Theta$ corresponds to a horizontal movement of the first mirror 120 $\Delta x$ along the second horizontal axis 116*b*. As another example, in some embodiments, a horizontal movement $\Delta x$ of the light source 112 along the first horizontal axis 116*a* corresponds to a change in the orientation angle 124 of the first mirror 120 with respect to the second horizontal axis 116*b* of $\Delta\Theta$.

The first mirror 120 is configured to reflect the light 114*c* to a second mirror 122 and/or a sensor 130. In some embodiments, a second mirror 122 is horizontally aligned with the first mirror 120 on the second horizontal axis 116*b*. The second mirror 122 has a second orientation angle 128 with respect to the second horizontal axis 116*b*. In some embodiments, the second orientation angle 128 is related to the first orientation angle 124 of the first mirror. It will be appreciated that the first orientation angle and the second orientation angle are related such that the first mirror 120 and the second mirror 122 are configured to reflect light to a sensor 130, as discussed in greater detail below. The first and second orientation angles 124, 128 are selected to transfer (or reflect) light from the light source 112 to the sensor 130 and can have any suitable values configured to transfer light from the source 112 to the sensor 130. In some embodiments, a horizontal position and/or the orientation angle 128 of the second mirror is adjustable. In other embodiments, the second mirror 122 has a fixed horizontal position and/or a fixed orientation angle 128 with respect to the second horizontal axis 116*b*. Although embodiments discussed herein include two mirrors, it will be appreciated that the backside scanner 110 can include a single mirror and/or any number of mirrors. For example, in some embodiments, the second mirror 122 can be omitted and the first mirror 120 can be configured to reflect the light 114*c* directly to a sensor 130. As another example, in some embodiments, one or more additional mirrors can be positioned between the second mirror 122 and the sensor 130 to reflect and/or direct the light 114*d* from the second mirror 122 to the sensor 130.

In some embodiments, the second mirror 122 is configured to direct a reflected light 114*d* at a third incident angle $\Theta_3$ to a sensor 130. The sensor 130 is configured to receive the reflected light 114*d* and generate a signal indicative of the backside topography of the wafer 10*c*. For example, in some embodiments, the sensor 130 is configured to detect one or more of a wavelength, an intensity, an angle, an/or any other suitable parameter of the reflected light 114*d*. In other embodiments, the sensor 130 is a digital imaging sensor configured to generate a digital image of the backside topography of the wafer 10*c*. The sensor 130 can include any suitable sensor, such as one or more of a photoconductive device, a photovoltaic, a photodiode, a phototransistor, and/or any other suitable sensor. For example, in some embodiments, the sensor 130 includes a charge-coupled device, a complementary metal-oxide-semiconductors (CMOS) device, and/or any other suitable device.

Although embodiments are illustrated including a single light source 112 and a single sensor 130, it will be appreciated that the backside scanner 110 can include any number of light sources 112, mirrors 120, 122, and/or sensors 130. For example, in some embodiments, the backside scanner 110 includes a plurality of light sources, a plurality of first mirrors, a plurality of second mirrors, and a plurality of sensors 130. Each of the plurality of light sources are configured to generate a light that is applied to a predetermined portion of a wafer 10*c*. The light is reflected from each of the predetermined portions to one of the plurality of first mirrors, one of the plurality of second mirrors, and/or one of the plurality of sensors 130. In some embodiments, the use of a plurality of light sources, mirrors, and/or sensors allows the backside scanner 110 to complete a backside topography scan at a higher rate.

In some embodiments, the backside scan information (e.g., digital imaging information) generated by the sensor 130 is provided to an OVL correction system 150. The OVL correction system 150 is configured to receive the backside scan information from the sensor 130 and generate a corrected OVL map, as discussed in greater detail below. The OVL correction system 150 can include any suitable elements for generating a corrected OVL map and/or controlling a semiconductor manufacture process, such as, for example, a processor configured to receive the backside scan information and generate the corrected OVL map. The OVL correction system 150 can include additional components, as discussed in greater detail with respect to FIG. 4.

The OVL correction system 150 is configured to receive the backside scan information from the sensor 130 and generate one or more OVL corrections for a semiconductor manufacture process for forming a circuit on the wafer 10c. In some embodiments, the OVL correction system 150 is configured to receive the backside scan information from the backside scanner 110 and generate a corrected OVL map for use in semiconductor manufacturing. In some embodiments, the OVL correction system 150 receives an uncorrected OVL map. The uncorrected OVL map can be generated, for example, from one or more topographical scans of the wafer 10c, modeling of the wafer 10c, modeling of a wafer formation process, modeling of an ideal wafer, and/or any other suitable process. The uncorrected OVL map can be generated using any suitable imaging system, such as a charge-coupled device (CCD) or other imaging system.

The OVL correction system 150 generates a topographical backside map from the backside scan data received from the backside scanner 110. The topographical backside map includes backside topography information for the wafer 10c, such as z-direction information. The z-direction information can be represented as a polynomial having any number of orders, with higher orders providing increased accuracy. For example, in some embodiments, a 5 order polynomial is used to create a z-profile containing z-direction information, although it will be appreciated that a greater or lesser number can also be used. The topographical backside map is combined with the uncorrected OVL map to generate a corrected OVL map. For example, in some embodiments, the combination of the uncorrected OVL map and the topographical backside map transforms the z-axis profile of the uncorrected OVL map to correct for linear and non-linear OVL errors caused by the topography of the wafer 10c, clamping effects of the table 102, and/or roughness of the table 102. The Z-axis profile of the topographical backside map is converted into X & Y axis displacement values with a gradient. For example, in some embodiments, a gradient is generated having values equal to $\Delta Z/\Delta X$, $\Delta Z/\Delta Y$, where $\Delta Z$ is the change in Z-axis values, $\Delta X$ is the change in X-axis values, and $\Delta Y$ is the change in Y-axis values for the uncorrected OVL map. The gradient values ($\Delta Z/\Delta X$, $\Delta Z/\Delta Y$) represent X & Y axis displacement values. The X & Y axis displacement values contain an OVL "fingerprint" or identifier that allows compensation by the OVL correction system 150 in real time during a manufacture process. In some embodiments, the OVL "fingerprint" includes a corrected OVL map, as described below.

In some embodiments, the OVL correction system 150 generates a corrected OVL map with a transformed z-axis profile. The corrected OVL map is generated by modifying the uncorrected OVL map by the generated topographical backside map (e.g., gradient map). The corrected OVL map is used during the semiconductor manufacturing process to eliminate (or compensate for) OVL errors on the processed wafer 10c, including linear and/or nonlinear OVL errors. In some embodiments, the topographical backside map is combined with the uncorrected OVL map after alignment of a wafer 10c using one or more front-side alignment marks.

Figure 3:
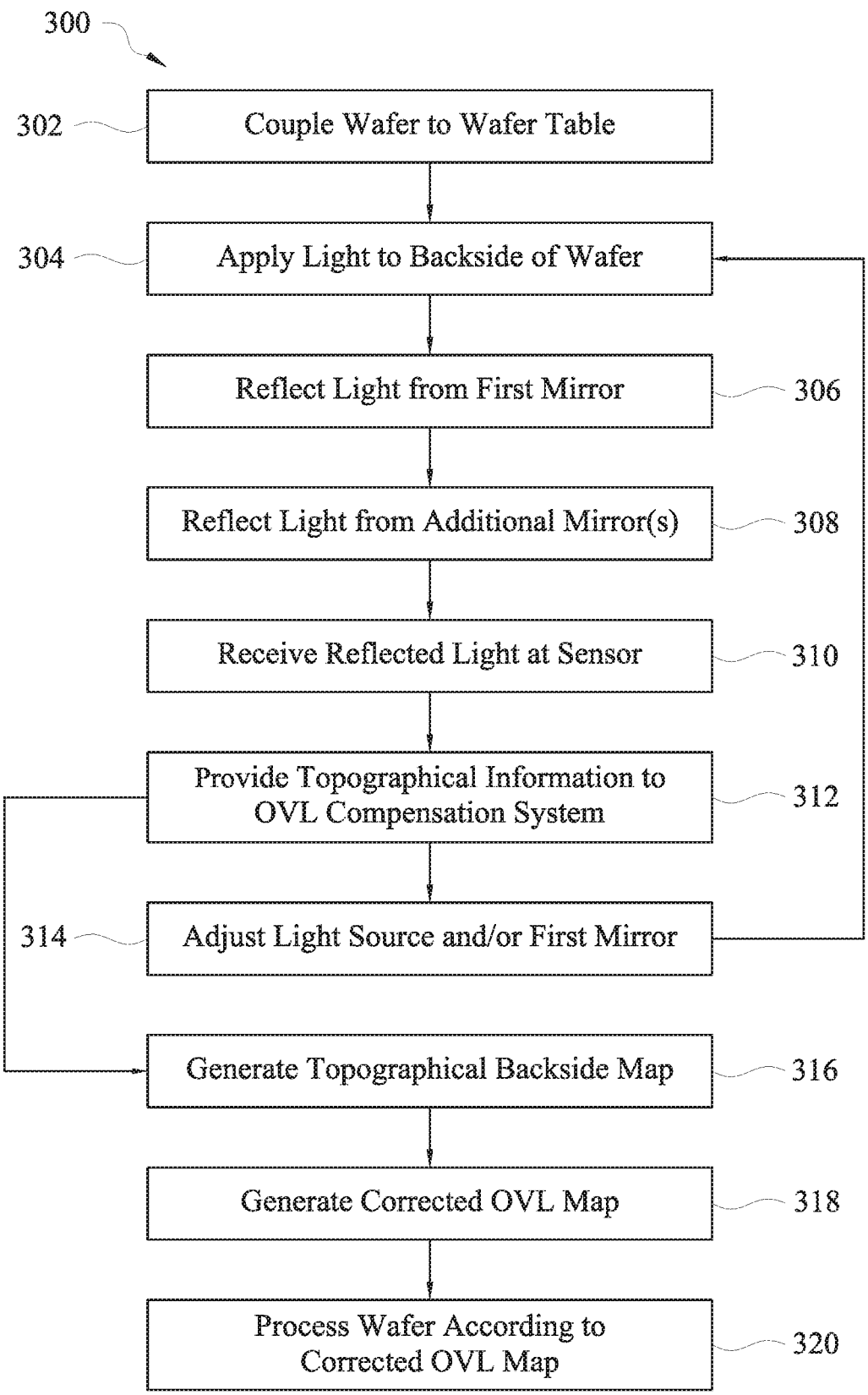
FIG. 3 illustrates a method of compensating for non-ideal wafer topography, in accordance with some embodiments.

FIG. 3 illustrates a method 300 of compensating for individual wafer topography, in accordance with some embodiments. At step 302, a wafer, such as wafer 10c, is coupled to a wafer table 102. The wafer 10c can be formed using any known process for forming semiconductor wafers. The wafer 10c includes a non-ideal surface topography. The wafer 10c is coupled to the wafer table 102 using any suitable mechanism, such as, for example, vacuum coupling, mechanical edge clamping, and/or any other suitable mechanism.

At step 304, a light source, such as light source 112 applies a light 114a to a backside 20 of the wafer 10c. The light 114a is generated using any suitable light source 112, such as, for example, a directed light source (such as a laser) and/or a multi-directional light source. The light 114a is reflected from the backside 20 of the wafer 10c at a first incident angle $\Theta_1$.

At step 306, the reflected light 114b is received at and reflected from a first mirror, such as first mirror 120. The light 114c is reflected from the first mirror 120 at a second incident angle $\Theta_2$. In some embodiments, the first mirror 120 has a first orientation angle 124 with respect to a horizontal axis 116b. The second incident angle $\Theta_2$ is related to the first orientation angle 124.

At optional step 308, the light 114c is received at and reflected from one or more additional mirrors, such as second mirror 122. The additional mirrors can be aligned with the first mirror 120 along the horizontal axis 116b and/or can be aligned along a vertical axis 132. The second mirror has a second orientation angle 126 with respect to the horizontal axis 116b. The light 114d is reflected from the second mirror 122 at a third incident angle $\Theta_3$. The third incident angle $\Theta_3$ is related to the second orientation angle 126. In some embodiments the second mirror 122 has a fixed horizontal position and/or predetermined angle 126 with respect to the horizontal axis 116b.

At step 310, the reflected light 114d is received at a sensor, such as sensor 130. The sensor 130 can be any suitable optical sensor configured to receive the reflected light 114d. For example, in some embodiments, the sensor 130 is a charge-coupled device. The sensor 130 detects the reflected light and generates backside scan information related to the backside topography of the wafer 10c. In embodiments including a charge-coupled device, the sensor 130 receives the reflected light 114d and generates digital image data related to the backside topography of the wafer 10c. In embodiments using other and/or additional sensor types, additional data indicative of the backside topography of the wafer 10c can be generated.

At step 312, the backside scan information generated by the sensor 130 is provided to an OVL compensation system 150. The OVL compensation system 150 includes any suitable elements configured to receive the backside scan information from the sensor 130, such as a processor, as discussed in greater detail below.

At step 314, a position and/or an orientation of the light source 112 and/or the first mirror 120 is adjusted. For example, in some embodiments, a horizontal position of the light source 112 and/or a horizontal position of the first mirror 120 is adjustable along respective first and second horizontal axes 116a, 116b. The horizontal position of the light source 112 and/or the first mirror 120 is adjusted to scan different portions of the backside 20 of the wafer 10c. The horizontal positions of the light source 112 and/or the first mirror 120 can be continuously adjusted along the respective horizontal axes 116a, 116b and/or can be adjusted to one or more discrete positions along the respective horizontal axes 116a, 116b.

In some embodiments, an orientation angle of the light source 112 and/or the first mirror 120 is adjusted. For example, in some embodiments, the first orientation angle 124 between the first mirror 120 and the second horizontal axis 116b is adjusted. The orientation angle of the light source 112 and/or the first mirror 120 is adjusted to scan different portions of the backside 20 of the wafer 10c. For example, in some embodiments, adjusting the light source 112 and/or the first mirror 120 causes a light 114 to be reflected to the sensor 130 from a variable position on the wafer 10c. In some embodiments, the orientation of the light source 112 and/or the first mirror 120 is continuously adjusted to scan a portion of the backside 20 of the wafer 10c.

Although steps 304-314 are illustrated as discrete steps, it will be appreciated that any and/or all of steps 304-314 can be performed as a single, continuous process. For example, in some embodiments, the light 114 is applied to the backside 20 of the wafer 10c while the light source 112 and/or the mirror 120 are moved along respective horizontal axes 116a, 116b. The sensor 130 receives a continuously and/or intermittently reflected light 114d from the mirrors 120, 122 and generates a continuous and/or intermittent output signal indicative of the backside scan information to the OVL compensation system 150.

At step 316, the OVL compensation system 150 generates a topographical backside map 204 of the wafer 10c. The topographical backside map 204 includes backside topography information for the wafer 10c, including z-direction information. In some embodiments, the backside map 204 is representative of local curves 14a-14f, edges 16a-16g, and/or other topographical features of the backside 20 of the wafer 10c.

At step 318, the OVL compensation system 150 generates a corrected OVL map 206. The corrected OVL map 206 is generated by modifying an uncorrected OVL map 202 using the topographical backside map 204. The corrected OVL map 206 includes OVL corrections for linear and/or non-linear OVL errors generated by the non-ideal topography of the wafer 10c, coupling effects, and/or roughness effects caused by the wafer table 102.

At step 320, one or more circuits are formed on the wafer 10c using the corrected OVL map 206 to compensate for OVL errors during exposure and/or other processing steps. The wafer 10c can be processed using any known system, such as, for example, the wafer processing system illustrated in FIG. 4.

Figure 4:
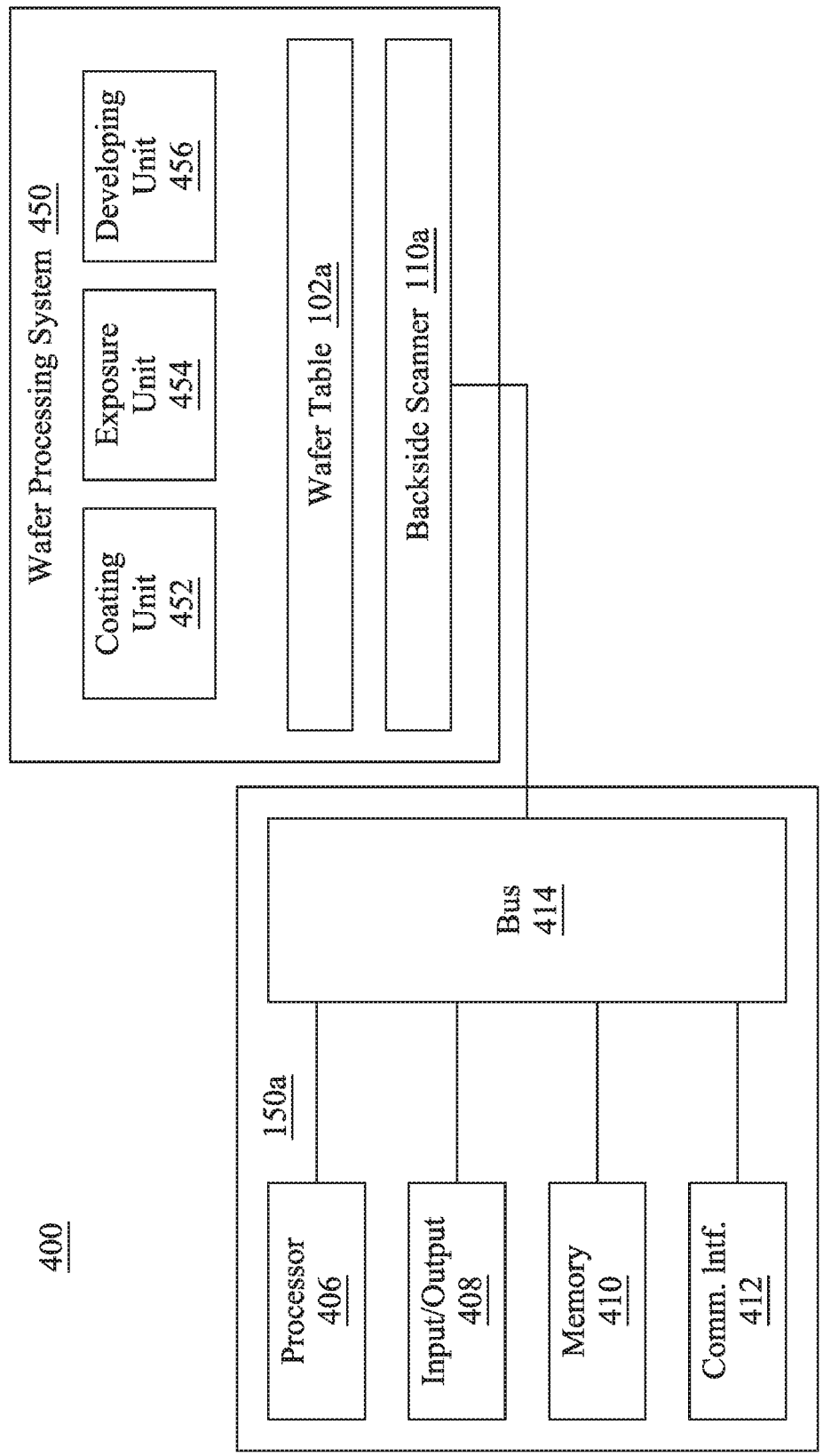
FIG. 4 illustrates a system for semiconductor manufacturing including OVL compensation, in accordance with some embodiments.

FIG. 4 illustrates a wafer processing system 400 including an OVL compensation system 150a, in accordance with some embodiments. The system 400 includes a wafer table 102a, a backside scanner 110a, an OVL compensation system 150a, and a semiconductor manufacturing system 450. The wafer table 102a, the backside scanner 110a, and the OVL compensation system are respectively similar to the wafer table 102, the backside scanner 110, and the OVL compensation system 150 discussed above, and similar description is not repeated herein.

The OVL compensation system 150a is coupled the semiconductor manufacturing system (i.e., wafer processing system) 450. The semiconductor manufacturing system 450 is configured to process a wafer, such as wafer 10c, coupled to the wafer table 102a, in accordance with one or more known methods. For example, in some embodiments, the semiconductor manufacturing system 450 includes a coating unit 452, an exposure unit 454, and/or a developing unit 456. The coating unit 452 is configured to apply one or more coatings to the wafer 10c. The coatings can be any suitable photoresist chemicals and applied using any photomasks configured for semiconductor manufacturing. The exposure unit 454 is configured to expose the coated wafer 10c to radiation to transfer a pattern on reticle to the surface of the wafer 10c. The exposure unit 454 exposes the wafer 10c to any suitable radiation source and/or pattern. A developing unit 456 develops the wafer 10c to dissolve certain areas of the exposed photoresist chemicals according to the amount of radiation (e.g., light) received during exposure. The areas retaining photoresist and without photoresist recreate the pattern on the reticle, which corresponds to a selected circuit.

In some embodiments, a position and/or alignment of one or more of the coating unit 452, the exposure unit 454, and/or the developing unit 456 are adjusted by the semiconductor manufacturing system 450 based on a corrected OVL map 206 received from the OVL compensation system 150a. The alignment adjustments compensate for the linear and/or non-linear OVL errors identified in the corrected OVL map. In some embodiments, the amount and/or type of coating applied by the coating unit 412 is adjusted based on information received from the OVL compensation system 150a. In other embodiments, the amount of radiation applied by the exposure unit 454 is adjusted based on information received from the OVL compensation system 150a. Although specific examples are discussed herein, it will be appreciated that the wafer processing system 450 can adjust any suitable parameters of the wafer processing system 450 (or elements of the wafer processing system 450) in response to the received corrected OVL map 206.

The OVL compensation system 150a is a representative device and may comprise a processor subsystem 406, an input/output subsystem 408, a memory subsystem 410, a communications interface 412, and a system bus 414. In some embodiments, one or more than one of the OVL compensation system 150a components may be combined or omitted such as, for example, not including the communications interface 412. In some embodiments, the OVL compensation system 150a may comprise other components not combined or comprised in those shown in FIG. 4. For example, the OVL compensation system 150a also may comprise a power subsystem. In other embodiments, the OVL compensation system 150a may comprise several instances of the components shown in FIG. 4. For example, the OVL compensation system 150a may comprise multiple memory subsystems 410. For the sake of conciseness and clarity, and not limitation, one of each of the components is shown in FIG. 4.

The processor subsystem 406 may comprise any processing circuitry operative to control the operations and performance of the OVL compensation system 150a. In various aspects, the processor subsystem 406 may be implemented as a general purpose processor, a chip multiprocessor (CMP), a dedicated processor, an embedded processor, a digital signal processor (DSP), a network processor, an input/output (I/O) processor, a media access control (MAC) processor, a radio baseband processor, a co-processor, a microprocessor such as a complex instruction set computer (CISC) microprocessor, a reduced instruction set computing (RISC) microprocessor, and/or a very long instruction word (VLIW) microprocessor, or other processing device. The processor subsystem 406 also may be implemented by a controller, a microcontroller, an application specific integrated circuit (ASIC), a field programmable gate array (FPGA), a programmable logic device (PLD), and so forth.

In various aspects, the processor subsystem 406 may be arranged to run an operating system (OS) and various applications. Examples of an OS comprise, for example, operating systems generally known under the trade name of Apple OS, Microsoft Windows OS, Android OS, and any other proprietary or open source OS. Examples of applications comprise, for example, a telephone application, a camera (e.g., digital camera, video camera) application, a browser application, a multimedia player application, a gaming application, a messaging application (e.g., email, short message, multimedia), a viewer application, and so forth.

In some embodiments, the OVL compensation system 150a may comprise a system bus 414 that couples various system components including the processing subsystem 406, the input/output subsystem 408, and the memory subsystem 410. The system bus 412 can be any of several types of bus structure(s) including a memory bus or memory controller, a peripheral bus or external bus, and/or a local bus using any variety of available bus architectures including, but not limited to, 9-bit bus, Industrial Standard Architecture (ISA), Micro-Channel Architecture (MSA), Extended ISA (EISA), Intelligent Drive Electronics (IDE), VESA Local Bus (VLB), Peripheral Component Interconnect Card International Association Bus (PCMCIA), Small Computers Interface (SCSI) or other proprietary bus, or any custom bus suitable for computing device applications.

In some embodiments, the input/output subsystem 408 may comprise any suitable mechanism or component to at least enable a user to provide input to the OVL compensation system 150a and the OVL compensation system 150a to provide output to the user. For example, the input/output subsystem 408 may comprise any suitable input mechanism, including but not limited to, a button, keypad, keyboard, click wheel, touch screen, or motion sensor. In some embodiments, the input/output subsystem 408 may comprise a capacitive sensing mechanism, or a multi-touch capacitive sensing mechanism.

In some embodiments, the input/output subsystem 408 may comprise a visual peripheral output device for providing a display visible to the user. For example, the visual peripheral output device may comprise a screen such as, for example, a Liquid Crystal Display (LCD) screen, incorporated into the OVL compensation system 150a. As another example, the visual peripheral output device may comprise a movable display or projecting system for providing a display of content on a surface remote from the OVL compensation system 150a. In some embodiments, the visual peripheral output device can comprise a coder/decoder, also known as a Codec, to convert digital media data into analog signals. For example, the visual peripheral output device may comprise video Codecs, audio Codecs, or any other suitable type of Codec.

The visual peripheral output device also may comprise display drivers, circuitry for driving display drivers, or both. The visual peripheral output device may be operative to display content under the direction of the processor subsystem 406. For example, the visual peripheral output device may be able to play media playback information, application screens for application implemented on the OVL compensation system 150a, information regarding ongoing communications operations, information regarding incoming communications requests, or device operation screens, to name only a few.

In some embodiments, the communications interface 412 may comprise any suitable hardware, software, or combination of hardware and software that is capable of coupling the OVL compensation system 150a to one or more networks and/or additional devices (such as, for example, the circuit generating system 404.) The communications interface 412 may be arranged to operate with any suitable technique for controlling information signals using a desired set of communications protocols, services or operating procedures. The communications interface 412 may comprise the appropriate physical connectors to connect with a corresponding communications medium, whether wired or wireless.

Vehicles of communication comprise a network. In various aspects, the network may comprise local area networks (LAN) as well as wide area networks (WAN) including without limitation Internet, wired channels, wireless channels, communication devices including telephones, computers, wire, radio, optical or other electromagnetic channels, and combinations thereof, including other devices and/or components capable of/associated with communicating data. For example, the communication environments comprise in-body communications, various devices, and various modes of communications such as wireless communications, wired communications, and combinations of the same.

Wireless communication modes comprise any mode of communication between points (e.g., nodes) that utilize, at least in part, wireless technology including various protocols and combinations of protocols associated with wireless transmission, data, and devices. The points comprise, for example, wireless devices such as wireless headsets, audio and multimedia devices and equipment, such as audio players and multimedia players, telephones, including mobile telephones and cordless telephones, and computers and computer-related devices and components, such as printers, network-connected machinery such as a circuit generating system 404, and/or any other suitable device or third-party device.

Wired communication modes comprise any mode of communication between points that utilize wired technology including various protocols and combinations of protocols associated with wired transmission, data, and devices. The points comprise, for example, devices such as audio and multimedia devices and equipment, such as audio players and multimedia players, telephones, including mobile telephones and cordless telephones, and computers and computer-related devices and components, such as printers, network-connected machinery such as a circuit generating system 404, and/or any other suitable device or third-party device. In various implementations, the wired communication modules may communicate in accordance with a number of wired protocols. Examples of wired protocols may comprise Universal Serial Bus (USB) communication, RS-232, RS-422, RS-423, RS-485 serial protocols, FireWire, Ethernet, Fibre Channel, MIDI, ATA, Serial ATA, PCI Express, T-1 (and variants), Industry Standard Architecture (ISA) parallel communication, Small Computer System Interface (SCSI) communication, or Peripheral Component Interconnect (PCI) communication, to name only a few examples.

Accordingly, in various aspects, the communications interface 412 may comprise one or more interfaces such as, for example, a wireless communications interface, a wired communications interface, a network interface, a transmit interface, a receive interface, a media interface, a system interface, a component interface, a switching interface, a chip interface, a controller, and so forth. When implemented by a wireless device or within wireless system, for example, the communications interface 412 may comprise a wireless interface comprising one or more antennas, transmitters, receivers, transceivers, amplifiers, filters, control logic, and so forth.

In various aspects, the communications interface 412 may provide voice and/or data communications functionality in accordance a number of wireless protocols. Examples of wireless protocols may comprise various wireless local area network (WLAN) protocols, including the Institute of Electrical and Electronics Engineers (IEEE) 802.xx series of protocols, such as IEEE 802.11a/b/g/n, IEEE 802.16, IEEE 802.20, and so forth. Other examples of wireless protocols may comprise various wireless wide area network (WWAN) protocols, such as GSM cellular radiotelephone system protocols with GPRS, CDMA cellular radiotelephone communication systems with 1xRTT, EDGE systems, EV-DO systems, EV-DV systems, HSDPA systems, and so forth. Further examples of wireless protocols may comprise wireless personal area network (PAN) protocols, such as an Infrared protocol, a protocol from the Bluetooth Special Interest Group (SIG) series of protocols, including Bluetooth Specification versions v1.0, v1.1, v1.2, v2.0, v2.0 with Enhanced Data Rate (EDR), as well as one or more Bluetooth Profiles, and so forth. Yet another example of wireless protocols may comprise near-field communication techniques and protocols, such as electro-magnetic induction (EMI) techniques. An example of EMI techniques may comprise passive or active radio-frequency identification (RFID) protocols and devices. Other suitable protocols may comprise Ultra Wide Band (UWB), Digital Office (DO), Digital Home, Trusted Platform Module (TPM), ZigBee, and so forth.

In some embodiments, at least one non-transitory computer-readable storage medium is provided having computer-executable instructions embodied thereon, wherein, when executed by at least one processor, the computer-executable instructions cause the at least one processor to perform embodiments of the methods described herein. This computer-readable storage medium can be embodied in memory subsystem 410.

In some embodiments, the memory subsystem 410 may comprise any machine-readable or computer-readable media capable of storing data, including both volatile/non-volatile memory and removable/non-removable memory. The memory subsystem 410 may comprise at least one non-volatile memory unit. The non-volatile memory unit is capable of storing one or more software programs. The software programs may contain, for example, applications, user data, device data, and/or configuration data, or combinations therefore, to name only a few. The software programs may contain instructions executable by the various components of the OVL compensation system 150a.

In various aspects, the memory subsystem 410 may comprise any machine-readable or computer-readable media capable of storing data, including both volatile/non-volatile memory and removable/non-removable memory. For example, memory may comprise read-only memory (ROM), random-access memory (RAM), dynamic RAM (DRAM), Double-Data-Rate DRAM (DDR-RAM), synchronous DRAM (SDRAM), static RAM (SRAM), programmable ROM (PROM), erasable programmable ROM (EPROM), electrically erasable programmable ROM (EEPROM), flash memory (e.g., NOR or NAND flash memory), content addressable memory (CAM), polymer memory (e.g., ferroelectric polymer memory), phase-change memory (e.g., ovonic memory), ferroelectric memory, silicon-oxide-nitride-oxide-silicon (SONOS) memory, disk memory (e.g., floppy disk, hard drive, optical disk, magnetic disk), or card (e.g., magnetic card, optical card), or any other type of media suitable for storing information.

In one embodiment, the memory subsystem 410 may contain an instruction set, in the form of a file for executing a method of generating one or more timing libraries (for example, from one or more circuit layouts provided to the electronic device 402) as described herein. The instruction set may be stored in any acceptable form of machine readable instructions, including source code or various appropriate programming languages. Some examples of programming languages that may be used to store the instruction set comprise, but are not limited to: Java, C, C++, C#, Python, Objective-C, Visual Basic, or .NET programming. In some embodiments a compiler or interpreter is comprised to convert the instruction set into machine executable code for execution by the processing subsystem 406.

In various embodiments, a scanner is disclosed. The scanner includes a light source configured to apply a light to a backside of a wafer. The light is reflected from the backside of the wafer at a first angle. A first mirror is configured to receive the light from the backside of the wafer and reflect the light at a second angle. A sensor is configured to receive the light from the first mirror and generate an output signal indicative of a non-ideal backside topography of the wafer.

In various embodiments, a method is disclosed. A light is applied to a first portion of a backside of a wafer. The backside of the wafer reflects the light at a first incident angle. The light is reflected light from the backside of the wafer is reflected to a sensor at a second incident angle. A first signal is generated by the sensor and is indicative of a backside topography of the wafer. A corrected overlay map is generated based on the first signal indicative of the backside topography of the wafer.

In various embodiments, a system is disclosed. The system includes a backside scanner having a horizontal axis and a vertical axis and a processor. The backside scanner includes a light source configured to apply a light to a semiconductor wafer. The light is reflected at a first angle. A first mirror is configured to receive the light from the wafer and reflect the light at a second angle. A sensor is configured to receive the light from the first mirror and generate an output signal indicative of a topography of the wafer. The processor is configured to receive the output signal from the sensor and generate a corrected overlay map configured to correct a semiconductor manufacture process for at least one non-linear overlay.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A scanner comprising:
   a light source configured to apply a light to a backside of a wafer at a first adjustable incident angle with respect to a first horizontal axis;
   a first mirror positioned to receive light reflected from a backside of a wafer when the light source is applied to the backside of the wafer and reflect the light, wherein a change in the first adjustable incident angle of $\Delta\Theta$ corresponds to a horizontal movement of the first mirror $\Delta x$ on a second horizontal axis parallel to the first horizontal axis; and
   a sensor positioned to receive light reflected from the first mirror when the light source is applied to the backside of the wafer, wherein the sensor is configured to generate an output signal indicative of a backside topography of the wafer.

2. The scanner of claim 1, wherein the light source is moveable on the first horizontal axis.

3. The scanner of claim 1, wherein the first mirror reflects the light at a second adjustable incident angle with respect to the first horizontal axis.

4. The scanner of claim 1, comprising a second mirror positioned to receive the light reflected from the first mirror and reflect the light to the sensor when the light is applied to the backside of the wafer.

5. The scanner of claim 4, wherein the second mirror is horizontally aligned with the first mirror.

6. The scanner of claim 4, wherein the second mirror is fixed.

7. The scanner of claim 1, comprising a processor configured to receive the output signal from the sensor and generate a corrected overlay map.

8. The scanner of claim 7, wherein the corrected overlay map is configured to correct for at least one non-linear overlay error.

9. The scanner of claim 7, wherein the corrected overlay map is generated by combining an uncorrected overlay map and a topographical backside map, wherein the topographical backside map is generated from the output signal of the sensor.

10. The scanner of claim 1, wherein the light is reflected from the backside of the wafer at a first angle and reflected from the first mirror at a second angle.

11. A method, comprising:
applying a light from a light source to a first portion of a backside of a wafer at a first incident angle, wherein the backside of the wafer reflects the light;
reflecting the light applied at the first incident angle from the backside of the wafer to a sensor;
applying the light from the light source to a second portion of the backside of the wafer at a second incident angle;
reflecting the light applied at the second incident angle from the backside of the wafer to the sensor;
generating, by the sensor, a signal indicative of a backside topography of the wafer; and
generating a corrected overlay map based on the signal indicative of the backside topography of the wafer.

12. The method of claim 11, comprising:
adjusting at least one of a horizontal position of a light source or a first mirror;
applying the light to a third portion of the backside of the wafer;
reflecting the light from the portion of the backside of the wafer to the sensor, wherein the signal indicative of the backside topography of the wafer includes backside topography of the first portion and the second portion of the backside of the wafer.

13. The method of claim 11, comprising manufacturing one or more circuits on the wafer using the corrected overlay map.

14. The method of claim 11, comprising:
reflecting the light from a first mirror to a second mirror; and
reflecting the light from the second mirror to the sensor.

15. The method of claim 14, wherein the second mirror is horizontally aligned with the first mirror.

16. A system, comprising:
a backside scanner comprising:
a light source configured to apply a light to a semiconductor wafer at a first adjustable incident angle with respect to a first horizontal axis;
a first mirror positioned to receive light reflected from the semiconductor wafer when the light source is applied to the semiconductor wafer and reflect the light, wherein a change in the first adjustable incident angle of $\Delta\Theta$ corresponds to a horizontal movement of the first mirror $\Delta x$ on a second horizontal axis parallel to the first horizontal axis; and
a sensor positioned to receive the light reflected from the first mirror when the light source is applied to the semiconductr wafer and generate an output signal indicative of a topography of the wafer;
a wafer table comprising a plurality of wafer supports extending from a top surface of the wafer table, wherein each of the plurality of wafer supports has a predetermined spacing and a predetermined height, and wherein the predetermined spacing, the predetermined height, or both of each the plurality of wafer supports has a variable value;
a processor configured to receive the output signal from the sensor and generate a corrected overlay map, wherein the corrected overlay map is configured to compensate for the variable value of each of the plurality of wafer supports; and
a semiconductor manufacturing system configured to form at least one layer of a semiconductor device on a semiconductor wafer coupled to the wafer table, wherein the corrected overlay map is configured to compensate for topography of the semiconductor wafer.

17. The system of claim 16, wherein the light source is moveable on the first horizontal axis.

18. The system of claim 16, wherein the wafer table is configured to support the semiconductor wafer with a backside of the semiconductor wafer oriented toward the backside scanner.

19. The system of claim 18, comprising a second mirror configured to receive the light from the first mirror and reflect the light to the sensor, wherein the second mirror is horizontally aligned with the first mirror.

20. The system of claim 16, wherein the corrected overlay map is generated by combining an uncorrected overlay map and a topographical map, wherein the topographical map is generated from the output signal of the sensor.

* * * * *